United States Patent [19]

Mogi et al.

[11] 4,127,822
[45] Nov. 28, 1978

[54] DIGITALLY CONTROLLED TUNER WITH AUTOMATIC FINE TUNING

[75] Inventors: Takao Mogi, Tokyo; Hisao Okada, Yokohama, both of Japan

[73] Assignee: Sony Corporation, Tokyo, Japan

[21] Appl. No.: 752,427

[22] Filed: Dec. 20, 1976

[30] Foreign Application Priority Data

Dec. 24, 1975 [JP] Japan .................................. 50-155640

[51] Int. Cl.² ............................................. H04B 1/06
[52] U.S. Cl. ................................... 325/464; 325/420; 358/191
[58] Field of Search ............................... 325/419–423, 325/464, 465, 457, 468, 470; 358/191, 193, 195; 334/14–16

[56] References Cited

U.S. PATENT DOCUMENTS

| | | | |
|---|---|---|---|
| 3,949,158 | 4/1976 | Rzeszewski et al. | 358/195 |
| 4,004,231 | 1/1977 | Elshuber et al. | 325/420 |
| 4,025,953 | 5/1977 | Sideris | 325/464 |
| 4,038,689 | 7/1977 | Rzeszewski et al. | 325/421 |
| 4,041,535 | 8/1977 | Rzeszewski et al. | 325/421 |

*Primary Examiner*—Robert L. Griffin
*Assistant Examiner*—Jin F. Ng

*Attorney, Agent, or Firm*—Lewis H. Eslinger; Alvin Sinderbrand

[57] ABSTRACT

A tuning system for digitally controlled electronically tuned tuner with automatic fine tuning (AFT) constantly operable to hold the tuner at a predetermined optimum frequency setting, especially a television channel. A reversible counter provides the digital signal to control the tuning of the tuner and is, itself, deliberately shifted from one setting to another by pulses from a source, such pulses being applied to the UP input terminal of the counter as the up-tuning pulses to shift the tuner frequency higher. Pulses from the same source are also used as down-tuning pulses when applied to the DOWN input terminal of the tuning pulses to a lower frequency supplied to two AFT AND circuits. One output logic up-tuning instruction signal $E_U$ of the AFT circuit enables the up-tuning AFT AND circuit only in a certain sub-range below the desired frequency. The other output logic down-turning instruction signal $E_D$ of the AFT circuit enables the other AFT AND circuit only in a certain sub-range above the desired frequency. Consequently, deliberate application of up-or-down-tuning pulses to the UP or DOWN terminals changes the count as desired, being only partially counteracted by the lower frequency, AFT-controlled pulses to the opposite counter terminal.

7 Claims, 23 Drawing Figures

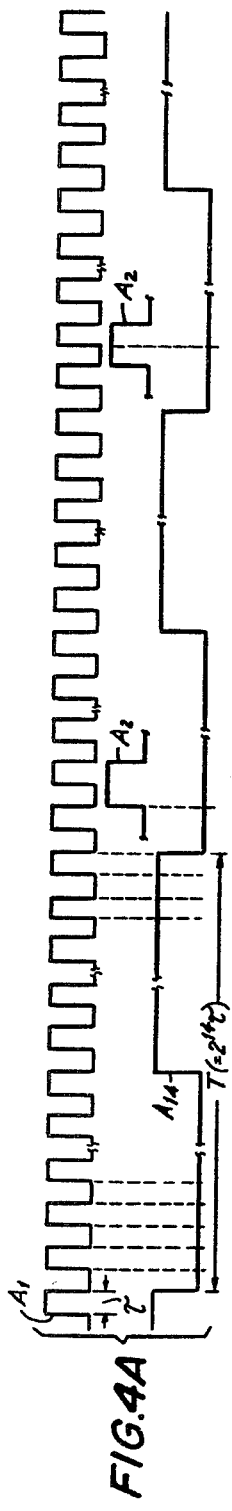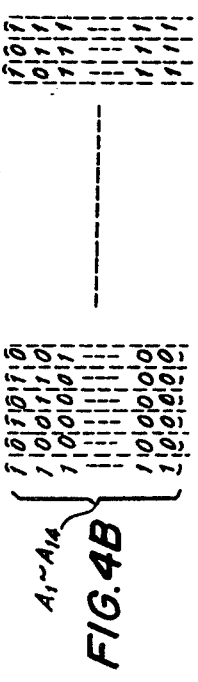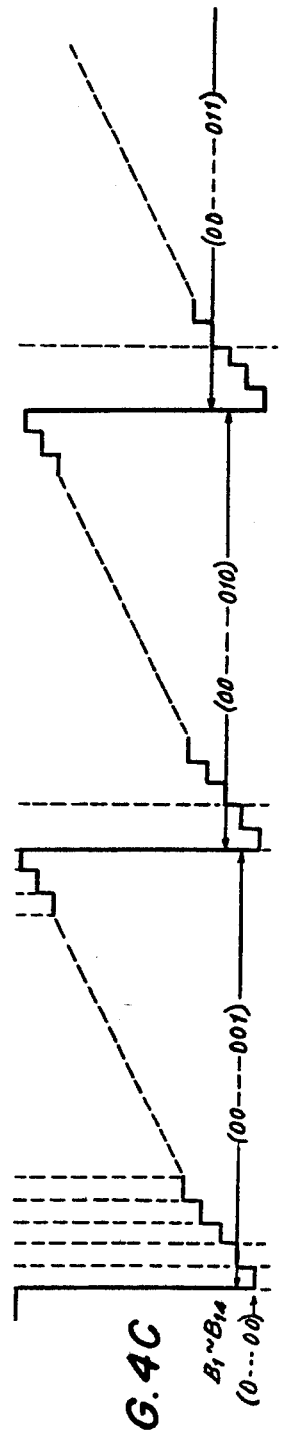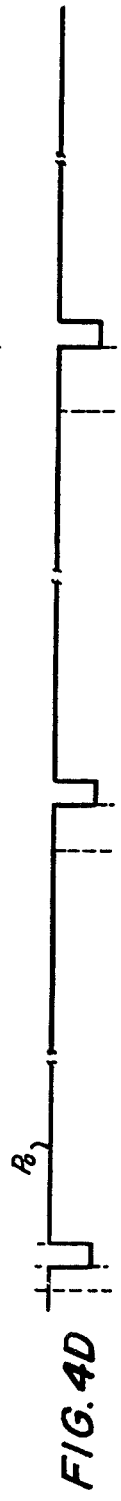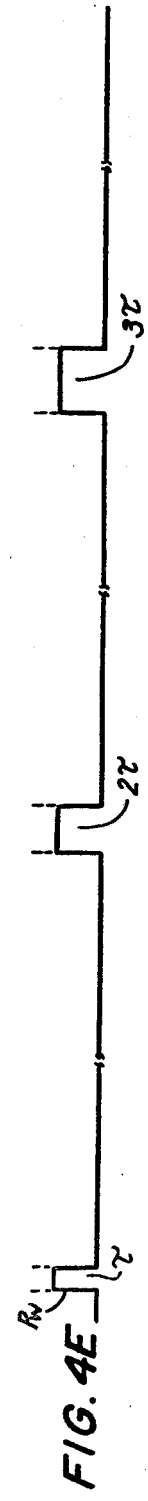

FIG. 7B ($M_1$) 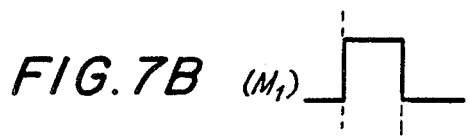
FIG. 7C ($P_G$) 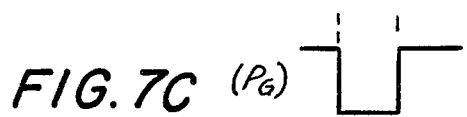
FIG. 7D ($M_2$) 
FIG. 7E ($M_3$) 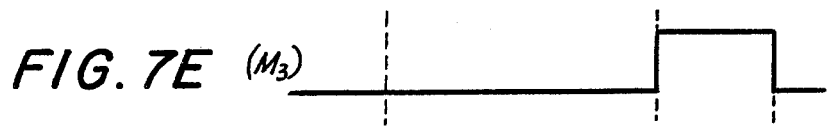
FIG. 7F ($P_{UD}$) 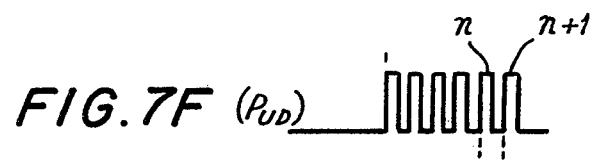

FIG. 7H ($M_4$) 
FIG. 7I ($P_M$) 

DIGITALLY CONTROLLED TUNER WITH AUTOMATIC FINE TUNING

RELATED PATENT APPLICATIONS

The invention described hereinafter is related to the inventions described in the following U.S. applications:

U.S. Patent application Ser. No. 716,655, filed Aug. 23, 1976, now U.S. Pat. No. 4,085,371, issued Apr. 18, 1978;

U.S. Patent application Ser. No. 716,702, filed Aug. 23, 1976, now U.S. Pat. No. 4,085,372, issued Apr. 18, 1978;

U.S. Patent application Ser. No. 716,654, filed Aug. 23, 1976;

U.S. Patent application Ser. No. 717,477, filed Aug. 25, 1976, now U.S. Pat. No. 4,058,772, issued Nov. 15, 1977;

U.S. Patent application Ser. No. 740,753, filed Nov. 10, 1976;

U.S. Patent application Ser. No. 743,008, filed Nov. 18, 1976, now U.S. Pat. No. 4,079,420, issued Mar. 14, 1978;

U.S. Patent application Ser. No. 743,523, filed Nov. 19, 1976, now U.S. Pat. No. 4,079,320, issued Mar. 14, 1978.

BACKGROUND OF THE INVENTION

Field of the Invention

This invention relates to a digitally controlled, electronic tuner that can be tuned to any of several different channels at different frequencies and which includes an automatic fine tuning (AFT) circuit to adjust the tuning precisely when the frequency to which the tuner is tuned is within a predetermined frequency range close to the exact desired frequency. In particular, the invention relates to a television signal tuner for a receiver having an AFT circuit to maintain the tuning at a selected frequency according to one of the available channels and further including means to overcome the effect of the AFT circuit when it is desired to shift the tuner to a different channel.

U.S. Pat. No. 4,085,371 describes a television receiver tuner in which the basic tuning is accomplished by controlling the voltage on the one or more varactors in the circuits to be tuned. Varactors are capacitors, the capacitance of which is determined by the magnitude of the direct voltage applied across the capacitor terminals. The tuning circuit includes a memory section that retains information in digital form according to the frequencies to which the tuner may be set. Such information may be generated in the overall circuit and applied to the memory section by a user of the television receiver, normally at the time the set is first placed in operation. Television channels are commonly identified by number and there are usually not more than a dozen or so channels at any one location. Thus a receiving set incorporating the electronic tuner of the aforesaid Pat. No. 4,085,371 is likely to be adjusted to receive each of the available channels in turn when the set is first placed in use. Thereafter tuning is simply accomplished by actuating a switch according to the desired channel.

However, because of aging factors in the circuit or environmental factors that affect the receiver, the initial tuning information stored in digital form may become incorrect after the lapse of an indeterminate time. If the memory section always instructs the varactor control circuit to apply a certain voltage to the varactor or to the multiple varactors according to the initial setting memorized in the memory circuit, the receiver might eventually be tuned to a frequency different from the desired channel. The difference would become increasingly apparent as fuzziness of image or perhaps distortion of sound. Accordingly, the aforesaid U.S. Pat. No. 4,085,371 defines an AFT circuit that begins to operate when the frequency to which the tuner is set is within a certain range of the exact frequency for a channel. The range may be, for example ±1.2 MHz. This range is further divided into a sub-range just above the exact desired frequency and extending out to +1.2MHz above the desired frequency and another sub-range that extends from the desired frequency to a frequency lower by 1.2 MHz. If the tuner is operating so that the carrier of the received signal falls within the upper sub-range, the AFT circuit applies pulse signals to adjust the tuning downwardly to the desired frequency. Conversely, if the carrier of the received signal is in the lower sub-range, a different signal is applied from the AFT circuit to shift the tuning upwardly to the desired frequency.

While the tuner has been referred to as being "set" at a frequency, that is somewhat incorrect; it is to be understood that the setting may be changing virtually continuously as the tuner is adjusted from one desired frequency to another. For example, if the tuner is set to receive channel 2 and the user decides to switch to channel 5, the tuner will be required to leave the proper setting for channel 2, pass through the upper sub-range of that channel, and pass through the lower and upper sub-ranges associated with channels 3 and 4 in succession in order to reach the lower sub-range and then the desired precise frequency of channel 5. The effect of the AFT circuit must be overcome in order to keep the voltage produced by the AFT circuit from locking the tuner at the frequency of channel 2 or the frequencies of channels 3 and 4.

OBJECTS OF THE INVENTION

It is a principal object of the present invention to provide a digital tuner having a control circuit that will, at all times, be capable of supplying an AFT control signal to effect both upward and downward tuning within a certain range of frequencies adjacent received frequencies, the control circuit further including means to supply signals to overcome the effect of the AFT signal.

It is a further object of the invention to generate the AFT control signal as pulses at a repetition rate lower than the repetition rate of the pulses supplied to effect deliberate shifting of the operating frequency of the tuner.

Further objects will become apparent from the following specification together with the related drawings.

SUMMARY OF THE INVENTION

In accordance with the present invention pulses are generated and are connected through a control circuit to a reference control counter to cause the counter either to count up or down. The digital output signal of the counter is applied to a digital-to-analog (D/A) converter that converts the digital count into an analog signal. This analog signal is applied to an electronic tuner to adjust voltage controlled means, such as one or more varactors therein, to determine the frequency to which the tuner is adjusted. This frequency may shift from instant to instant as the count in the counter changes either up or down.

An AFT circuit, which may include a frequency discriminator, is connected to the output of the tuner or to an intermediate frequency amplifier of the type that commonly follows the tuner in a cascade connection therewith. The AFT circuit is arranged to operate only within a certain band of frequencies. The center of this band is the carrier frequency of the signal applied to the AFT circuit. When the carrier of an incoming signal is in an upper sub-range above the center frequency of the discriminator, the AFT circuit generates a logic signal at the down-counting output terminal of the AFT circuit to effect downward tuning. When the carrier of the received signal at the input of the AFT circuit is in a lower sub-range below the desired frequency, the AFT circuit generates a logic signal at its up-counting output terminal to effect upward tuning of the electronic tuner.

The counter circuit is controlled by pulses received from a control circuit. These pulses may be applied either to the up-counting or the down-counting input circuit of the counter. Between the pulse generator and the up-counting and down-counting input terminals are two AND circuits, each connected in cascade with a respective OR circuit. The AND circuits are controlled, respectively, by logic signals which, in turn, are controlled by actuation of an up-counting or down-counting switch. The pulse signals applied from the pulse generator pass through one AND circuit to its associated OR circuit to the up-counting terminal when the switch to effect up-counting is actuated to enable that AND circuit. Conversely, signals from the pulse generator pass through the other AND circuit and its associated OR circuit to the down-counting terminal of the counter when the down-counting switch is actuated to enable the latter AND circuit.

Two other AND circuits have their output terminals connected to second input terminals of the aforementioned OR circuits, respectively. One of the latter AND circuits is connected to the down-counting output terminal of the AFT circuit to receive the logic signal therefrom to enable that AND circuit when the input signal to the AFT circuit is in the upper sub-range. Conversely, the other of the latter two AND circuits has an input terminal connected to the up-counting output terminal of the AFT circuit to be enabled by the logic signal therefrom when the frequency of the signal applied to the input of the AFT circuit is in the lower sub-range.

The other input terminal of the latter two AND circuits is connected to receive pulses from the pulse generator. However, in accordance with this invention, between the pulse generator and the latter two AND circuits is a frequency divider so that the pulses applied to the latter two AND circuits are at a sub-multiple frequency of the signals applied to the first two AND circuits. As a result, although the AFT circuit is constantly operating and supplies either an up-counting logic signal or a down-counting logic signal when the signal applied to its input is in the appropriate range, the resulting AFT pulses that attempt to bring the counter to a specific count value or to hold it at that count value will not be able to do so because the pulses that reach the counter by deliberate actuation of either the up-counting control switch or the down-counting control switch have a higher frequency that changes the count of the counter faster than the count can be pulled back to a previous condition.

BRIEF DESCRIPTION OF THE DRAWINGS

FIGS. 4A–4E are waveform diagrams to which reference will be made in explaining the operation of the channel selecting apparatus of FIG. 1.

FIGS. 6A–6C and FIGS. 7A–7I are waveform diagrams to which reference will be made in explaining the automatic fine tuning operation of the channel selecting apparatus according to this invention.

DESCRIPTION OF THE PREFERRED EMBODIMENTS

Figure 1:
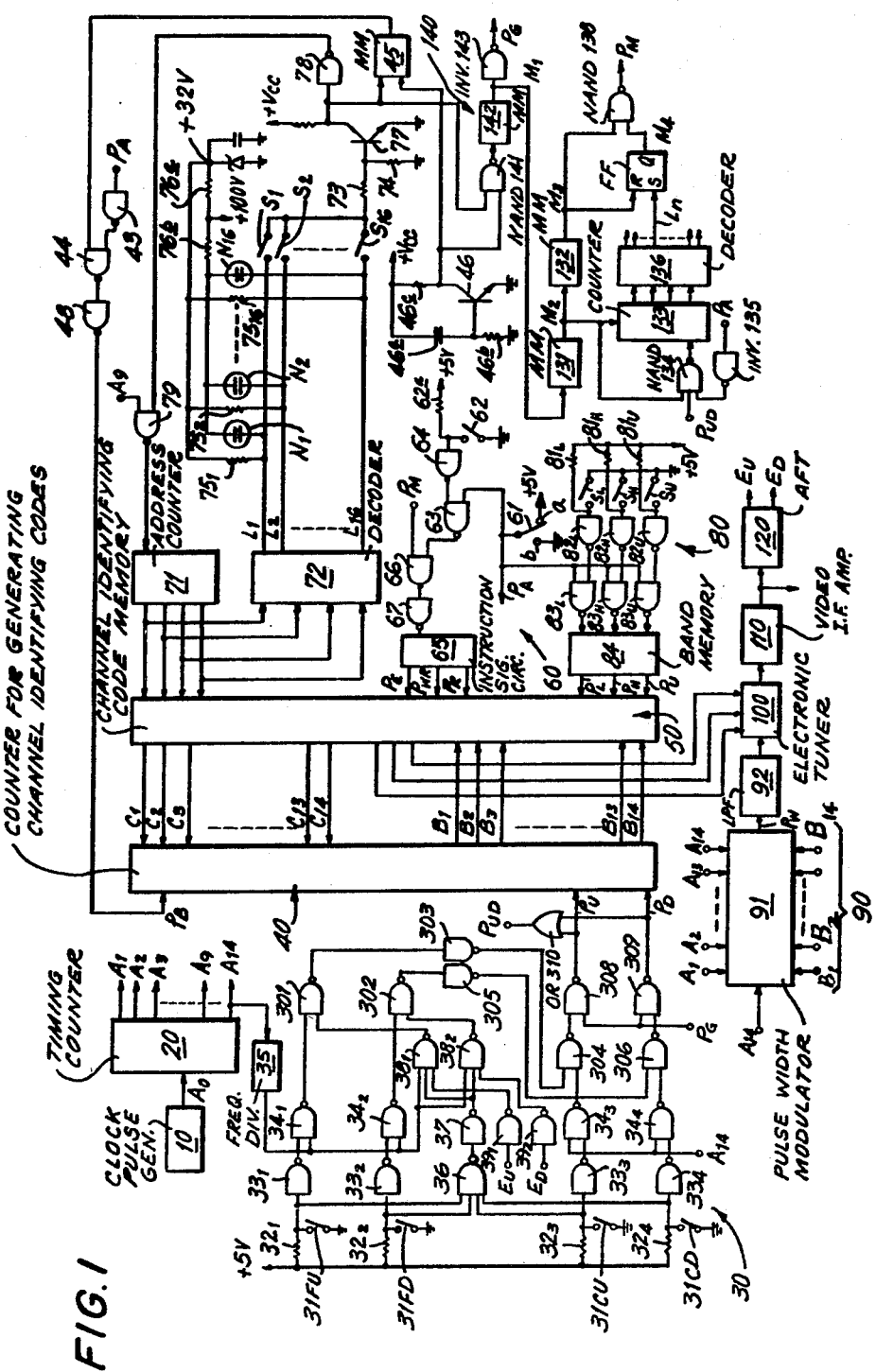
FIG. 1 is a block diagram illustrating a channel selecting apparatus with AFT.

FIG. 1 is a block diagram of a channel selecting circuit as claimed in the aforesaid companion case Ser. No. 716,654 but will be described here as an especially useful introduction to the present invention. It comprises a generator 10 of a clock pulse $A_o$ which is applied to a timing counter 20 for producing a circulating digital, or binary, code $A_1$, $A_2$, $A_3$---$A_{14}$. A manually controllable sweep pulse generating circuit 30 is provided to produce either up-tuning pulses $P_U$ or down-tuning pulses $P_D$ to corresponding terminals of an up-down counter 40. In the programming mode of the apparatus, the counter 40 counts the pulses $P_U$ or $P_D$ to establish channel identification digital codes $B_1$, $B_2$, $B_3$---$B_{14}$ corresponding to the changing counts of the counter 40. These codes are recorded, or stored, at selected addresses in a memory 50.

Further, the channel selecting apparatus shown in FIG. 1 generally comprises a memory control circuit 60 for selectively establishing the programming mode of operation or a channel selecting mode of operation in which a channel identification digital code previously stored at a selected address in memory 50 is read out therefrom, as indicated at $C_1$, $C_2$, $C_3$---$C_{14}$, and applied to counter 40 to establish the corresponding count in the latter. A manually controllable address selecting circuit 70 is provided for activating a selected address in the memory 50 for either recording a selected channel identification code or reading out a previously stored channel identification code from that address during the programming or channel selecting modes, respectively. A band-indicating signal-forming circuit 80 which, in the programming mode of operation, produces a signal indicating the band of the channel indicating code then being stored at a selected address of memory 50, with such band indicating signal also being stored at the respective address.

The channel selecting apparatus shown in FIG. 1 also generally comprises a D/A converter 90 that provides an analog control voltage for the varactor of a selected band in an electronic tuner 100. The analog control voltage corresponds to the count of the counter 40 as established by a channel identification digital code selectively read out of the memory 50 in the channel selecting mode of the apparatus. In the programming mode the analog voltage corresponds to the changing counts produced by the counter 40 when the latter counts tuning pulses from the generating circuit 30. A video intermediate frequency amplifier 110 receives the output of the tuner 100 and has its own output applied to a conventional video detector circuit as in the usual color television receiver.

The output of the video intermediate frequency amplifier 110 is also applied to an automatic fine tuning (AFT) circuit 120 which includes a frequency discriminator that responds to a video carrier wave in the output of the IF amplifier 110 to produce AFT logic signals from up-counting and down-counting outputs $E_U$ and $E_D$. These logic signals are produced when the channel identification code then being applied to the converter 90 for establishing a receiving frequency in the channel selecting mode of the apparatus has to be modified upwardly or downwardly, respectively, for attaining precisely the correct receiving frequency for the respective channel. The discriminated outputs $E_U$ and $E_D$ are applied to the sweep pulse generating circuit 30. As will be hereinafter described in detail, the circuit 30 responds to the discriminated output $E_U$ or $E_D$ to provide tuning pulses to be counted by the counter 40 for modifying the channel identifying code applied therefrom to the converter 90 to obtain precisely the correct receiving frequency, that is, for achieving the desired AFT operation.

Further, a memory rewriting circuit 130 is provided in the channel selecting apparatus. As will be hereinafter described in detail, when the extent to which the channel identification code being read out of a selected address in the memory 50 to the counter 40 has to be modified to obtain the correct receiving frequency for the respective channel exceeds a predetermined amount, the rewriting circuit causes the writing of the modified channel identifying code at the selected address in place of the code originally stored thereat. In this way, the memory rewriting circuit 130 ensures that the channel identification codes stored in the memory 50 will not, in time, result in respective receiving frequencies that are outside the pull-in range of the AFT operation. Finally, the channel selecting apparatus comprises an AFT inhibit circuit 140 which is effective, as will be hereinafter described in detail, to prevent the AFT operation during the initial application of power to the apparatus and during operation of the address selecting circuit 70.

In the channel selecting apparatus as generally described above, the clock pulse $A_o$ from the generator 10 may have a frequency of, for example, 4 MHz resulting in a period $\tau$ of 0.25 μsec. In the timing counter 20, the clock pulse $A_o$ is counted to produce pulses $A_1$, $A_2$, $A_3$---$A_{14}$ which are frequency-divided in sequence so as to range from pulses $A_1$ that have a period of 0.5 μsec. and a pulse width of 0.25 μsec., to pulses $A_{14}$ that have a period of 4.096 m.sec. and a pulse width of 2.048 m.sec. The pulses $A_1$, $A_2$, $A_3$---$A_{14}$ form a 14-bit circulating digital code which changes its state $2^{14}$ times, that is, 16,384 times, within the circulating or repeating period of $T = 2^{14}\tau = 4.096$ m. sec. (FIGS. 4A and B).

In the pulse generating circuit 30 as shown in FIG. 1, a fine up-tuning switch 31FU, a fine down-tuning switch 31FD, a coarse up-tuning switch 31CU and a coarse down-tuning switch 31CD are connected in series with respective resistors $32_1$, $32_2$, $32_3$ and $32_4$, and such series circuits are connected in parallel between a voltage source +5V and ground. The switches 31FU, 31FD, 31CU and 31CD are normally open, as shown, to provide logic signals at the high logic level "1" at the junctions of such switches with the respective resistors $32_1$, $32_2$, $32_3$ and $32_4$ and the input terminals of inverters $33_1$, $33_2$, $33_3$ and $33_4$. When any of the switches 31FU, 31FD, 31CU and 31CD are closed, a logic signal at the low logic level "0" is applied to the input terminals of the respective inverters $33_1$, $33_2$, $33_3$ and $33_4$. The "1" or "0" logic controlled by the switches 31FU, 31FD, 31CU and 31DC are inverted by the corresponding inverters to first input terminals of NAND circuits $34_1$, $34_2$, $34_3$ and $34_4$, respectively. The pulses $A_{14}$ having a period of 4.096 m. sec. are applied from the timing counter 20, as coarse tuning pulses, to second inputs of the NAND circuits $34_3$ and $34_4$. The pulses $A_{14}$ are also applied to a frequency divider 35 to be divided, for example, by 64, to provide fine tuning pulses having a period of 262.144 m. sec., and such fine tuning pulses are applied to second inputs of the NAND circuits $34_1$ and $34_2$.

The "1" or "0" logic signals controlled by the switches 31FU, 31FD, 31CU and 31CD are also all applied to a AND circuit 36 which has its output terminal connected through an inverter 37 to NAND circuits $38_1$ and $38_2$. Each of the NAND circuits $38_1$ and $38_2$ also has the fine tuning pulses from the frequency divider 35 applied to it. Further, the separate outputs $E_U$ and $E_D$ from the AFT circuit 120 are applied to inverters $39_1$ and $39_2$, respectively, which have their outputs applied to the NAND circuits $38_1$ and $38_2$, respectively. The outputs of the NAND circuits $34_1$ and $38_1$ are applied to a NAND circuit 301, while the outputs of the NAND circuits $34_2$ and $38_2$ are similarly applied to a NAND circuit 302. The output of the NAND circuit 301 is applied through an inverter 303 to a NAND circuit 304 which also receives the output of NAND circuit $34_3$ directly. The output of the NAND circuit 302 is similarly applied through an inverter 305 to a NAND circuit 306 which also receives the output of the NAND circuit $34_4$. The outputs of the NAND circuits 304 and 306 are respectively applied to the NAND circuits 308 and 309, each of which also receives an AFT inhibit pulse $P_G$ from circuit 140, and the outputs of the NAND circuits 308 and 309 are applied as up-tuning pulses $P_U$ and down-tuning pulses $P_D$, respectively, to the counter 40. Further, the outputs of the NAND circuits 308 and 309 are connected to an OR circuit 310 for providing pulses $P_{UD}$ to the memory rewriting circuit 130.

Figure 2:
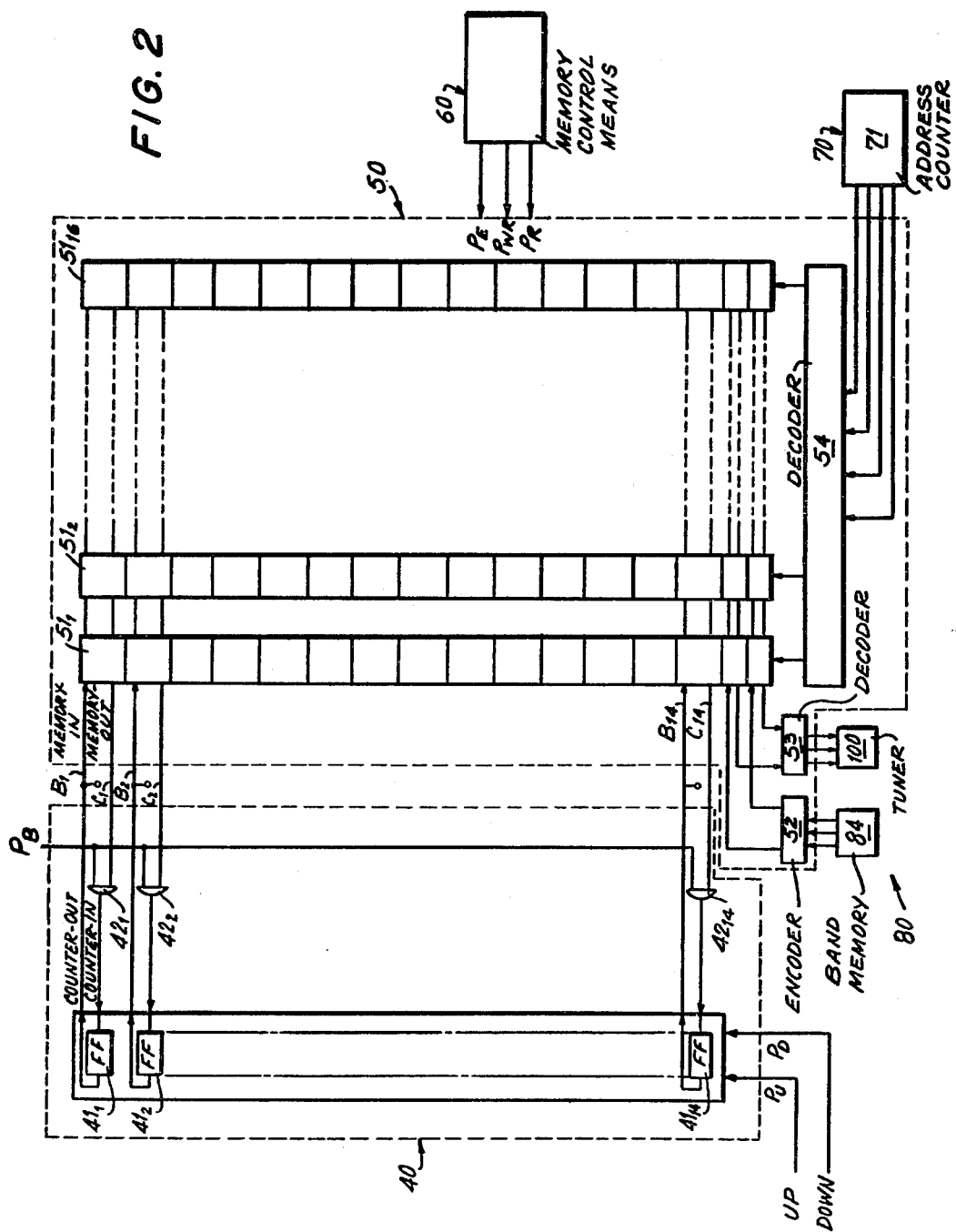
FIG. 2 is a block diagram illustrating, in greater detail, an up-down counter for generating channel identifying codes and a memory which are included in the apparatus of FIG. 1.

As shown schematically in FIG. 2, the counter 40 may be a conventional 14-bit up-down counter having 14 flip-flops $41_1$, $42_2$---$41_{14}$ which have their states of conductivity changed sequentially to effect up or down counting in response to the pulses $P_U$ or $P_D$, respectively, to establish, at the end of a counting interval, the respective bits of sequentially changing 14-bit channel identification codes $B_1$, $B_2$---$B_{14}$. In the programming mode of operation, the channel identification codes are applied from the counter 40 to the memory 50 for writing or storage of a selected one of such codes at a selectively activated address in the memory. Simultaneously, the sequentially changing channel identification codes are also applied from the counter 40 to the digital-to-analog converter 90 to provide a correspondingly varied control voltage for the varactor in a selected band of the electronic tuner 100. The flip-flops $41_1$–$41_{14}$ of the counter 40 are further adapted, in the channel selecting mode of operation, to have their respective states established by the respective bits $C_1$–$C_{14}$ of a memorized channel identification code which are read out of a selectively activated address in the memory 50 to the AND circuits $42_1$–$42_{14}$ which also receive a load pulse $P_B$ during the channel selecting operation for passing the bits read out of the memory, as hereinafter described in detail, and which have their outputs respectively connected to the flip-flops $41_1$–$41_{14}$, respectively.

As also shown in FIG. 2, the memory 50 may be made up of 16 memory units $51_1$, $51_2$---$51_{16}$ at respective addresses in the memory 50, with the memory unit at each address being capable of storing 16 bits of digital information, that is, the 14 bits of a selected channel identification code from the counter 40 and 2-bits from an encoder 52 for the band indicating signal received from the circuit 80 for indicating whether the channel identified by the 14-bit digital code being stored at the respective address is a vhf or uhf channel, and, if it is a vhf channel, whether it is a low channel or a high channel in such broadcast band, respectively. Further, the memory 50 is schematically shown to include a decoder 53 which, in the programming and channel selecting modes of operation, receives the 2-bits of digital information representing the band of the channels identified by the 14-bit codes being applied to, or read out from, respectively, the memory units for providing a corresponding band identification signal applied to the electronic tuner 100 for selecting the corresponding band of the latter. Finally, the memory 50 also includes a decoder 54 which receives a 4-bit digital code from the address selecting circuit 70, as hereinafter described in detail. The 4-bit code is effective to activate or address the corresponding one of the memory units $51_1$, $51_2$---$51_{16}$. Preferably, the memory units of memory 50 are composed of non-volatile cells, such as, metal-nitride-oxide-silicon (MNOS) elements, so that the contents thereof, while being electrically alterable, are held unchanged during periods when the memory 50 is disconnected from a source of power.

Returning again to FIG. 1, it will be seen that the memory control 60 includes a mode change-over switch 61 having a movable contact that is manually actuable to engage fixed contacts $a$ and $b$, selectively. The fixed contact $a$ is connected to a voltage source +5V so that, when the movable contact of switch 61 engages the fixed contact $a$ to establish the programming mode of operation, a signal $P_A$ at the high logic level "1" is obtained from switch 61. On the other hand, the fixed contact $b$ of switch 61 is connected to ground so that, when the movable contact of switch 61 is engaged with the fixed contact $b$ for establishing the channel selecting mode of operation, the signal $P_A$ is at the low logic level "0". The memory control 60 also has a normally open switch 62 which is connected in series with a resistor $62a$ between a voltage source +5V and ground. The signal $P_A$ from the mode change-over switch 61 is shown to be applied to one input of a NAND circuit 63 which has its other input connected through an inverter 64 with a junction in the connection between the switch 62 and resistor $62a$. It will be apparent that, when the switch 62 is in its normally open position, as shown, the output of the inverter 64 will be at the low level "0", whereas, when the switch 62 is manually closed to effect a writing operation with the apparatus in its programming mode, the output of the inverter 64 will be at the high level "1". The output of the NAND circuit 63 is shown to be applied to a NAND circuit 66 along with a rewrite instruction signal $P_M$ from the circuit 130, and the output of the NAND circuit 66 is applied through an inverter 67 to an instruction signal forming circuit 65. When the output of the NAND circuit 63 or the instruction signal $P_M$ is at the low level "0", the circuit 65 supplies an erasing pulse $P_E$ and then a writing pulse $P_{WR}$ to the memory unit at a selected address in the memory 50 so as to erase the previously stored contents in such memory unit and, thereafter, to write in the selected memory unit the 14-bit channel identification code then being received from the counter 40 and the 2-bit code which represents the band of the channel identified by the code being written in the respective memory unit. On the other hand, when the output of the NAND circuit 63 or the instruction signal $P_M$ is at the high level "1", the instruction signal forming circuit 65 applies a read pulse $P_T$ to the memory unit 50 to read out the contents stored in the selected memory unit.

The band indicating signal forming circuit 80 is shown to include normally open switches $S_L$, $S_H$ and $S_U$ which are connected in series with respective resistors $81_L$, $81_H$ and $81_U$ between a voltage source +5V and ground. Junctions between switches $S_L$, $S_H$ and $S_U$ and the respective resistors are connected to inverters $82_L$, $82_H$ and $82_U$, respectively, which have their outputs connected to first inputs of NAND circuits $83_L$, $83_H$ and $83_U$, respectively, while the second inputs of such NAND circuits receive the signal $P_A$ from the mode change-over switch 61. The outputs of the NAND circuits $83_L$, $83_H$ and $83_U$ are applied to a band memory 84 which is effective to apply a band indicating signal $P_L$, $P_H$ or $P_U$ to the encoder 52 in the memory 50 in response to a low level or "0" output from the NAND circuit $83_L$, $83_H$ or $83_U$, respectively. It will be apparent that, in the programming mode of operation established by engagement of the switch 61 with its fixed contact $a$ to provide the signal $P_A$ with the high value "1", the output of any of the NAND circuit $83_L$, $83_H$ or $83_U$ has the low value "0" only when the respective switch $S_L$, $S_H$ or $S_U$ is manually closed to indicate that the channel identified by the 14-bit code to be written at a selected address in memory 50 is a low vhf channel, a high vhf channel or a uhf channel, respectively.

The address selecting circuit 70 of the illustrated channel selecting apparatus according to this invention includes 16 normally open address selecting switches $S_1$, $S_2$---$S_{16}$ which are each selectively manually actuable to the closed condition for selecting a corresponding one of the 16 addresses or memory units in memory 50 to be activated during a programming operation or channel selecting operation of the apparatus. The address selecting circuit 70 is further shown to include neon tubes or other indicators $N_1$, $N_2$---$N_{16}$ corresponding to the switches $S_1$, $S_2$---$S_{16}$, and address counter 71 which, in response to the closing of a selected one of the switches $S_1$–$S_{16}$, produces a corresponding 4-bit addressing code applied to the decoder 54 in the memory 50 for addressing the corresponding memory unit in the latter, and a decoder 72 which receives the coded output of the address counter 71 and, in response thereto, provides a "0" output signal on a respective one of 16 output lines $L_1$, $L_2$---$L_{16}$. The switches $S_1$-$S_{16}$ are connected, at one side, in common, through series resistors 73 and 74 to ground, while the opposite sides of switches $S_1$-$S_{16}$ are connected to lines $L_1$-$L_{16}$, respectively. Further, the lines $L_1$-$L_{16}$ are connected through resistors $75_1$-$75_{16}$, respectively, and a common resistor 76a with a voltage source +100V, while the neon tubes, or indicators, $N_1$-$N_{16}$ are connected between the lines $L_1$-$L_{16}$, respectively, and the same voltage source +100V through a common resistor 76b. The junction between the series-connected resistors 73 and 74 is connected to the base electrode of a switching transistor 77 having its emitter electrode connected to ground and its collector electrode connected to a voltage source +$V_{cc}$ and to an inverter 78. The output of the inverter 78 is connected to one input of a NAND circuit 79 which, at its other input, receives the pulses $A_9$ produced by timing counter 20 and having a period of 0.128 m.sec. Finally, the output of the NAND circuit 79 is applied to the address counter 71 which is operative to count each "0" output of the NAND circuit 79.

In order to provide the load pulse $P_B$ to the AND circuits $42_1$-$42_{14}$ of the counter 40 to read out to the latter the channel identifying code $C_1$-$C_{14}$ stored in a selected memory unit of memory 50 in the channel selecting mode of operation, an inverter 43 is included. This inverter receives the signal $P_A$ from the memory control 60 and has its output connected to one of the inputs of a NAND circuit 44. The other input of the NAND circuit 44 is connected to the output of a monostable multivibrator 45 triggered by a high collector output representing a logical "1" from the transistor 77 or from a transistor 46 of a time constant circuit 47. The output of the NAND circuit 44 is connected through an inverter 48 to AND circuits $42_1$-$42_{14}$ of the counter 40. The load pulse $P_B$ is produced when the output of the NAND circuit 44 is "0", that is, when the signal $P_A$ has the value "0" for the channel selecting mode of operation and the monostable multivibrator 45 is triggered to produce a pulse having the value "1" for a predetermined period of, for example, 50 m.sec. In the time constant circuit 47, the base electrode of the transistor 46 is connected between a capacitor 46a and a resistor 46b which are connected, in series, between the voltage source +$V_{cc}$ and ground, while the collector of transistor 46 is connected through a resistor 46c with the voltage source and the emitter electrode of transistor 46 is connected to ground. Therefore, when the apparatus is initially connected to a power source, the transistor 46 is made conductive and, hence its collector output is "0". After a predetermined lapse of time, for example 50 m.sec., the transistor 46 is turned off so that its collector output rises to the value "1" for triggering the monostable multivibrator 45 which then provides its output for the predetermined additional time of 50 m.sec.

The digital-to-analog converter 90 preferably includes a pulse-width modulator 91 operative to produce a chain of pulses at a predetermined repetition rate with the width of each of such pulses being dependent on the channel identifying code $B_1$, $B_2$---$B_{14}$ obtained from the counter 40 either in response to the counting by the latter of the tuning pulses from the generating circuit 30 or in response to the read out of a channel identifying code stored at a selected address in the memory 50, and a low pass filter 92 which receives the chain of pulses from the modulator 91 to provide the analog control voltage for a varactor of the electronic tuner 100 in dependence on the modulated width of the pulses. More particularly, the pulse-width modulator 91 determines the pulse width of the chain of pulses applied to the low pass filter 92 in dependence on the absence of coincidence between the channel identifying code $B_1$, $B_2$---$B_{14}$ obtained from the counter 40 and the circulating digital code $A_1$, $A_2$---$A_{14}$ applied to the modulator 91 from the timing counter 20.

Figure 3:
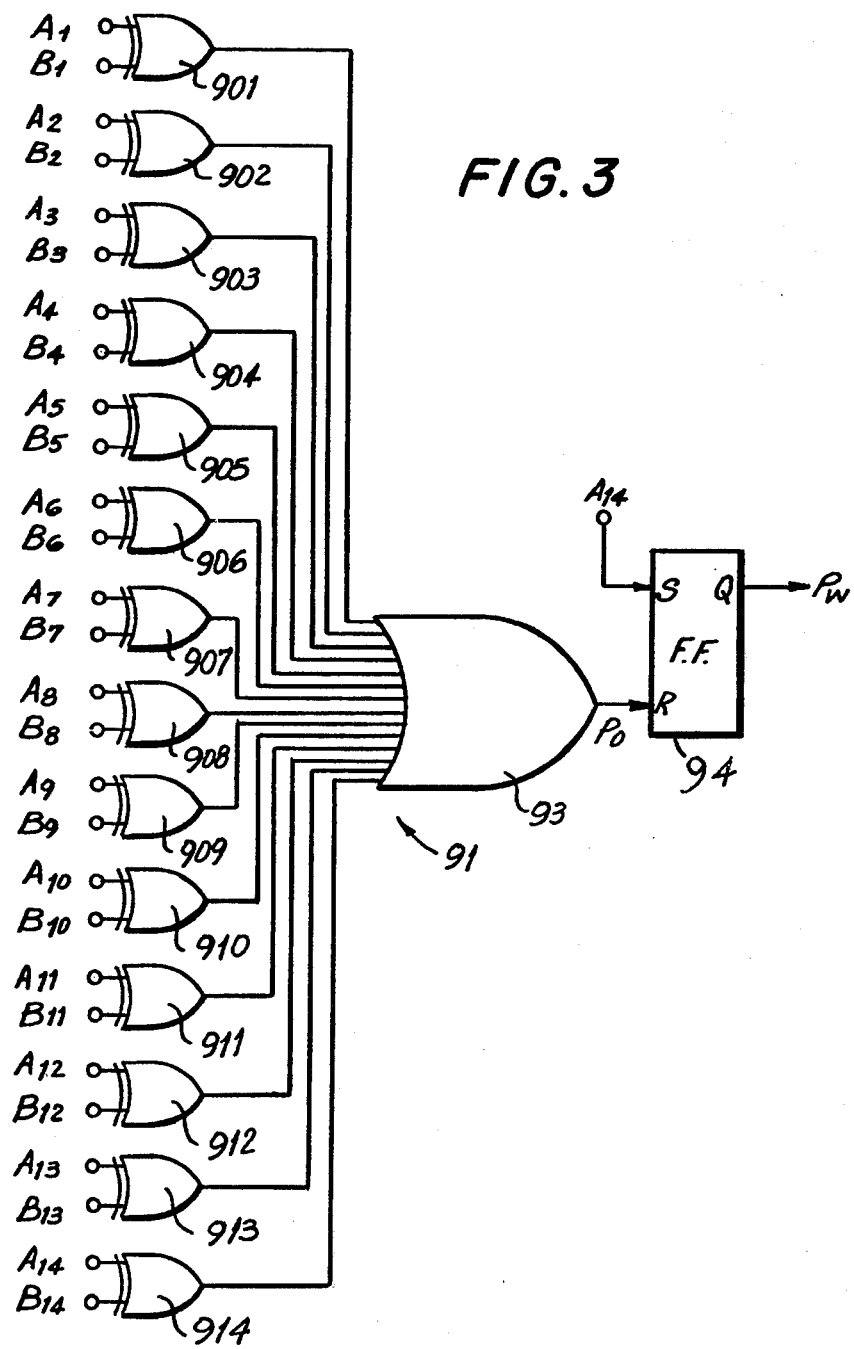
FIG. 3 is a detail block diagram of a pulse-width modulator which is included in the apparatus shown in FIG. 1.

As shown in FIG. 3, the pulse-width modulator 90 includes 14 exclusive OR circuits 901, 902---914, each having first and second inputs which respectively receive the bits or pulses $A_1$, $A_2$---$A_{14}$ of the circulating code and the bits $B_1$, $B_2$---$B_{14}$ of the channel identifying code. The outputs of all of the exclusive OR circuits 901-914 are applied through an OR circuit 93 to the reset terminal R of a flip-flop 94 which has the pulse $A_{14}$ with a period of 4.096 m.sec. applied from timing counter 20 to the set terminal S of flip-flop 94. The flip-flop 94 is adapted to be set by the falling edge or side of each pulse $A_{14}$ so as to provide an output of value "1" at its output terminal Q, that is, to initiate an output pulse $P_W$. The flip-flop 94 is reset to terminate the output pulse $P_W$, that is, to return the output voltage to "0", in response to the falling edge or side of an output $P_O$ from the OR circuit 93.

As is apparent from FIGS. 4B-4E, an output pulse $P_W$ is initiated at the output Q of flip-flop 94 when the circulating code $A_1$, $A_2$---$A_{14}$ returns from the state (11111111111111) to the state (00000000000000). So long as the circulating code $A_1$, $A_2$---$A_{14}$ is not coincident in level with the channel identification code then being applied to pulse-width modulator 91, one or more of the exclusive OR circuits 901-914 produces an output "1" with the result that the output $P_O$ of the OR circuit 93 remains at the level "1" (FIG. 4B). Upon the coincidence of all buts of the circulating code $A_1$, $A_2$---$A_{14}$ with the corresponding bits of the channel identification code $B_1$, $B_2$---$B_{14}$, which may occur at any count during each circulating period T of the circulating code, the outputs of all of the exclusive OR circuits 901-914 attain the value "0", with the result that the output $P_O$ of the OR circuit 93 falls from the value "1" to the value "0" so as to reset the flip-flop 94 and thereby return the output of the latter to the value "0". Thus, during each circulating period T of the circulating code $A_1$, $A_2$---$A_{14}$ from the timing counter 20, an output pulse $P_W$, that is, an output of the value "1", is obtained from the flip-flop 94 during the time interval between the return of the circulating code $A_1$, $A_2$---$A_{14}$ from the state (11111111111111) to the state (00000000000000) and the coincidence of the circulating code with the channel identifying code $B_1$, $B_2$---$B_{14}$. Therefore, when a change is effected in the channel identification code $B_1$, $B_2$---$B_{14}$ being applied to the pulse-width modulator 91, a corresponding change occurs in the width of the output pulse $P_w$ obtained from modulator 91 during each circulating period of the circulating code.

For example, as shown in the left-hand portions of FIGS. 4A-4E, if the channel identifying code $B_1$, $B_2$---$B_{14}$ applied to pulse-width modulator 91 is (00000000000001) the output pulse $P_W$ produced during each circulating period of the circulating code $A_1$, $A_2$---$A_{14}$ commences at the beginning of the circulating period, that is, when the circulating code returns from the state (11111111111111) to the state (00000000000000), and each such output pulse $P_W$ terminates at the commencement of the first pulse $A_1$, at which time the circulating code (00000000000000) coincides with the received channel identifying code (00000000000001) to cause the output $P_O$ of the OR circuit 93 to fall from "1" to "0". Thus, the output pulse $P_W$ produced during each circulating period of the circulating code has a pulse width of $\tau$. On the other hand, as shown in the middle portion of FIGS. 4A–4E, if the channel identifying code $B_1,B_2$---$B_{14}$ being received by the pulse-width modulator 91 is (00000000000010), the coincidence of that channel identification code with the circulating code $A_1,A_2$---$A_{14}$ occurs, during each circulating period of the circulating code, at the commencement of the pulse $A_2$, so that the resulting output pulse $P_W$ obtained during each circulating period has a width of $2\tau$. Similarly, as shown at the right-hand portions of FIGS. 4A–4E, if the channel identification code $B_1,B_2$---$B_{14}$ received by the modulator 91 is (00000000000011), the coincidence of such channel identification code with the circulating code $A_1,A_2$---$A_{14}$ during each circulating period of the latter occurs at the commencement of the pulse $A_1$ appearing during the existence of the first pulse $A_2$ so that the resulting output pulse $P_W$ obtained during each circulating period has a pulse-width $3\tau$.

Thus, the output pulses $P_W$ produced by the modulator 91 during the successive circulating periods T of the circulating code $A_1, A_2$---$A_{14}$ have their pulse-widths determined by the channel identification code $B_1, B_2$---$B_{14}$ then being received by the modulator, and the low pass filter 92 is effective to smooth such output pulses $P_W$ from the modulator 91 and to deliver an analog or DC voltage having a value that corresponds to the switch of the pulses $P_W$.

In the electronic tuner 100 a signal $V_H$, $V_L$ or U received from the decoder 53 of the memory 50 selects either the high band or the low band of a vhf tuning section or the uhf tuning section, respectively, for operation. The frequency to be received is determined by the voltage controlled variable reactance element or varactor, such as a variable capacitance diode, of the selected tuning section. The voltage controlled element, in turn, is controlled by the analog, or DC, control voltage from the low pass filter 92, which is applied to the video intermediate frequency amplifier circuit 110.

Figure 5:
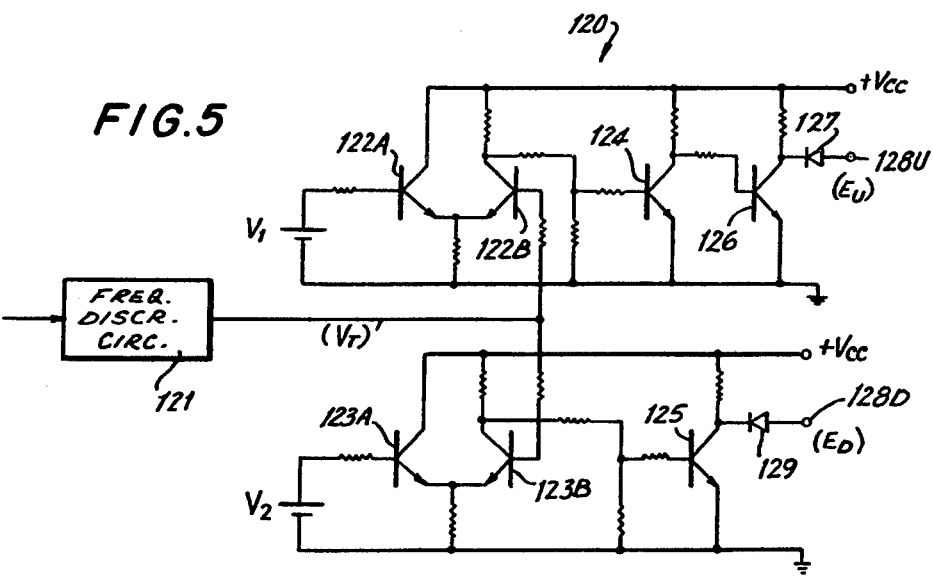
FIG. 5 is a schematic circuit diagram showing a portion of an automatic fine tuning circuit that is included in the apparatus according to this invention.
Figure 6A:
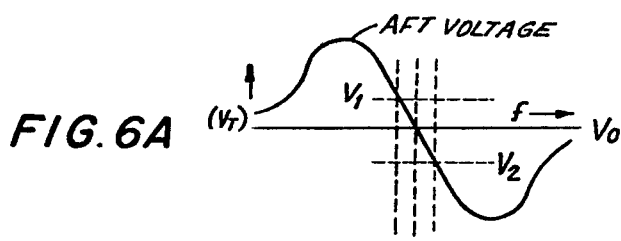

The AFT circuit 120 is shown in more detail in FIG. 5. The AFT circuit comprises a conventional frequency discriminator circuit 121 which is connected to the output of the video IF amplifier 110 and provides an AFT voltage $V_T$. As shown in FIG. 6A, the AFT voltage $V_T$ has a predetermined value $V_o$ when the video intermediate frequency $f$ has the correct value $f_o$, and the AFT voltage $V_T$ varies from the value $V_o$ in accordance with a generally S-shaped curve for values of the video intermediate frequency above and below the value $f_o$. The AFT circuit 120 also comprises transistors 122A and 122B constituting a first differential amplifier, and transistors 123A and 123B constituting a second differential amplifier. Reference voltages $V_1$ and $V_2$ having values to satisfy the inequality $V_1 > V_o > V_2$ are respectively applied to the base electrodes of the transistors 122A and 123A, while the AFT voltage $V_T$ from the circuit 121 is applied to the base electrodes of the transistors 122B and 123B. Further, the collector outputs of the transistors 122B and 123B are applied to the base electrodes of the transistors 124 and 125, respectively, and the collector output of the transistor 124 is applied, in turn, to the base electrode of a transistor 126. Finally, the collector output of the transistor 126 is delivered through a diode 127 to an output terminal 128U to provide the discriminated output $E_U$ at the latter, and the collector output of the transistor 125 is delivered through a diode 129 to an output terminal 128D to provide the discriminated output $E_D$ at the latter.

Figure 6B:
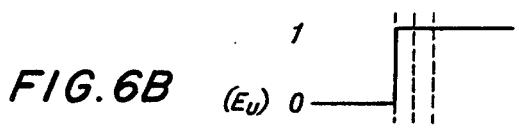
Figure 6C:
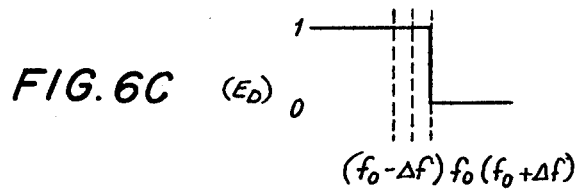

When the AFT voltage $V_T$ is larger than the reference voltage $V_1$, that is, when the video intermediate frequency from amplifier 110 is less than $(f_o - \Delta f)$, transistors 122A and 122B are respectively non-conductive and conductive. Therefore, transistor 124 is non-conductive and the transistor 126 is conductive. As a result, the output voltage $E_U$ is "0", as shown in FIG. 6B. On the other hand, transistor 123B is conductive, which causes the transistor 125 to be non-conductive, so that the output voltage $E_D$ is "1", as shown in FIG. 6C.

If the video intermediate frequency from amplifier 110 is in the range between the frequencies $(f_o - \Delta f)$ and $(f_o + \Delta f)$, that is, within the proper tuning range, the AFT voltage from the circuit 121 is between $V_1$ and $V_2$ and, therefore, the transistor 123B remains conductive and the output $E_D$ continues to be "1". However, with $V_T$ being less than $V_1$, the transistor 122B is non-conductive and, as a result, the transistor 126 is made non-conductive so that the output $E_U$ becomes "1".

Finally, when the AFT voltage $V_T$ from the frequency discriminating circuit 121 is less than $V_2$, that is, when the video intermediate frequency from the amplifier 110 is greater than $(f_o + \Delta f)$, the output $E_U$ remains "1", but the transistor 123B becomes non-conductive, which makes the transistor 125 conductive, and as a result, the output $E_D$ becomes "0".

In the case of a channel selecting apparatus for a color television receiver, the reference voltages $V_1$ and $V_2$ of the AFT circuit 120 are suitably selected so that $\Delta f$ will be about 50 kHz. In the correctly tuned condition, that is, when the frequency $f$ is in the range between $f_o - 50$ kHz, the outputs $E_U$ and $E_D$ are both "1" and no correction is to be made in the binary code $B_1$, $B_2$---$B_{14}$ applied to pulse width modulator 91 which determines the local oscillation frequency established in tuner 100. On the other hand, when $f$ is less than $f_o - 50$ kHz, the resulting "0" state of discriminated output $E_U$ is effective to cause the pulse generating circuit 30 (FIG. 1) to provide up-tuning correction pulses which are counted by the counter 40 to modify the binary code $B_1, B_2$---$B_{14}$ so as to raise the local oscillation frequency and thereby bring the receiver to the correctly tuned condition. Conversely, if the frequency $f$ is greater than $f_o + 50$ kHz, the resulting "0" state of the output $E_D$ is effective, in the pulse generating circuit 30 to cause down-tuning correction pulses to be applied to the counter 40 so that the binary code $B_1$, $B_2$---$B_{14}$ being applied from the counter 40 to the pulse width modulator 91 is modified to decrease the local oscillation frequency and thereby achieve the correctly tuned condition of the receiver. The upward-tuning and down-tuning pulses applied to the counter 40 in response to the "0" states of the AFT outputs $E_U$ and $E_D$, respectively, are the fine tuning pulses from the frequency divider 35.

More particularly, reference to FIG. 1 will show that, when the output $E_U$ is "0", up-tuning pulses having the period of the fine tuning pulses from the frequency divider 35 are applied to the counter 40 by way of the circuit constituted by the inverter $39_1$, NAND circuits $38_1$ and 301, inverter 303, and NAND circuits 304 and 308. On the other hand, when the output $E_D$ is "0", down-tuning pulses also having the period of the tine tuning pulses from the frequency divider 35 are applied to the counter 40 through the circuit constituted by the inverter $39_2$, NAND circuits $38_2$ and 302, inverter 305, and NAND circuits 306 and 309. When any one of the switches 31FU, 31FD, 31CU and 31CD is manually closed, supplying up-tuning pulses or down-tuning pulses to the counter 40 from the circuit 30 in response to the closing of such switch is preferential. That is, the resulting signal applied to each of the NAND circuits $38_1$ and $38_2$ through the NAND circuit 36 and inverter 37 prevents the passage of any correction pulse through the NAND circuit $38_1$ or $38_2$ even though the output $E_U$ or $E_D$ may then be "0".

Figure 7A:
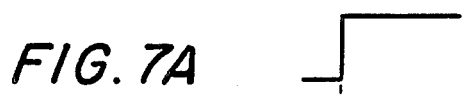

In order to inhibit or prevent the AFT operation of the channel selecting apparatus according to this invention during the operation of the address selecting circuit 70 for activating a selected one of the addresses or memory units in the memory 50 in a programming or channel selecting mode of the apparatus, the AFT inhibiting circuit 140 includes a NAND circuit 141 receiving the collector outputs of the transistors 46 and 77, a monostable multivibrator 142 which is triggered by the rising edge of the output from the NAND circuit 141, as shown in FIG. 7A to produce a positive pulse $M_1$ shown in FIG. 7B. The pulse $M_1$ has a width of, for example, 10 m.sec. The pulse $M_1$ is further applied to an inverter 143 to produce a negative inhibiting pulse $P_G$ shown in FIG. 7C. As previously mentioned, the pulse $P_G$ is applied to the NAND circuits 308 and 309 of the pulse generating circuit 30. Thus, during the existence or occurrence of the negative inhibit pulse $P_G$, neither up-tuning nor down-tuning pulses can pass through the respective NAND circuit 308 or 309 to the counter 40.

The memory rewriting circuit 130 comprises a monostable multivibrator 131 which is triggered by the falling edge of an output $M_1$ pulse from the monostable multivibrator 142 to produce an output pulse $M_2$, as shown in FIG. 7D. The falling edge of the pulse $M_2$ triggers a monostable multivibrator 132 to produce an output pulse $M_3$, as shown in FIG. 7E and resets a counter 133. The up-tuning and down-tuning pulses $P_{UD}$ applied by the circuit 30 to the counter 40 are also applied through an OR circuit 310 to a NAND circuit 134 which also has applied thereto the output pulse $M_2$ of the monostable multivibrator 131. Further, the signal $P_A$ from the mode changeover switch 61 of the memory control circuit 60 is applied through an inverter 135 to the NAND circuit 134. Thus, the up-tuning and down-tuning pulses $P_{UD}$ are passed through the NAND circuit 134 to be counted by the counter 133 only upon the occurrence of the output pulse $M_2$. This occurs when the inhibit pulse $P_G$ has been terminated to indicate that the operation of the address selecting circuit 70 for activating one of the memory units or addresses of the memory 50 has been completed, and further, only when the mode change-over switch 61 engages its fixed contact $b$ to provide the signal or output $P_A$ with the value "0" for establishing the channel selecting mode of operation of the apparatus.

Figure 7G:
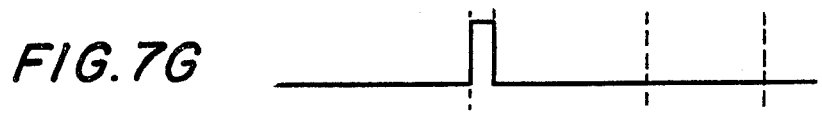

After each operation of the address selecting circuit 70 with the apparatus in its channel selecting mode so that the channel identifying code stored at the selected address of the memory 50 is read out to the counter 40 and the latter applies the corresponding binary code $B_1$, $B_2$---$B_{14}$ to the pulse width modulator 91 to establish a respective receiving frequency, any operation of the AFT circuit 120 to cause circuit 30 to apply up-tuning or down-tuning pulses to the counter 40 for modifying the code $B_1$, $B_2$---$B_{14}$ so as to obtain the correctly tuned condition also causes such up-tuning or down-tuning pulses to be counted by the counter 133. In the memory rewriting circuit 130, a decoder 136 is associated with the counter 133 and is operative, when the counter 133, after being reset by the rising side of the output pulse $M_2$, has counted $n$ upward or downward correcting pulses $P_{UD}$ (FIG. 7F), to provide an output "1" (FIG. 7G) on its output line $L_n$ by which a flip-flop 137 is set to provide an output pulse $M_4$ shown in FIG. 7H. The flip-flop 137 is reset by the falling side of the output pulse $M_3$ from the monostable multivibrator 132 so as to terminate the output pulse $M_4$. Finally, the output pulses $M_3$ and $M_4$ are applied to a NAND circuit 138 which provides the rewriting instruction $P_M$ having the value "0", as shown in FIG. 7I, during the simultaneous occurrence of output pulses $M_3$ and $M_4$. Application of the rewriting instruction $P_M$ to the NAND circuit 66 in the memory control circuit 60 with the apparatus in its channel selecting mode has substantially the same effect as closing the writing switch 62 when the apparatus is in its programming mode. In other words, the application of the rewriting instruction $P_M$ to the NAND circuit 66 causes the instruction signal forming circuit 65 to supply an erasing pulse $P_E$ and then a writing pulse $P_{WR}$ to the selected memory unit in the memory 50 so as to erase the channel identification code $B_1$, $B_2$---$B_{14}$ previously stored in that memory unit and to write, in place of such channel identification code, the modified channel identification code which is then established by the counter 40 following the AFT operation. If, for example $n+1$ correction pulses are applied to the counter 40 in response to an AFT operation for achieving the correctly tuned condition when a channel identification code is read out of a selected one of the memory units of the memory 50, the resulting modified channel identification code is rewritten in the same memory unit in place of the original channel identification code. Of course, if less than $n$ correction pulses are applied to the counter 40 in response to an AFT operation, the flip-flop 137 is not set and, therefore, the rewriting instruction $P_M$ is not obtained, with the result that the channel identification code originally written or programmed in the respective memory unit of memory 50 remains unchanged therein.

The above described channel selecting apparatus according to this invention operates as follows.

PROGRAMMING MODE OF OPERATION

When it is desired to program the channel selecting apparatus, that is, to store at the various addresses in memory channel identification codes corresponding to various channels that are receivable in the region where the television receiver is located so that, thereafter, such channels can be received or selected merely by actuation of the switches $S_1$-$S_{16}$ corresponding to the respective addresses, the mode change-over switch 61 is engaged with its fixed contact $a$ for selecting the programming mode of operation. If it is desired, for example, to store at the address or memory unit 51 of the memory 50 a channel identification code corresponding to the receiving frequency for channel "one" in the Tokyo area of Japan, the address selecting switch $S_1$ is manually closed. Closing switch $S_1$ makes the transistor 77 in address selecting circuit 70 conductive so that the collector output of that transistor has the value "0". Thus, the output of the inverter 78 becomes "1" with the result that the NAND circuit 79 provides a "0" output on receiving each of the pulses $A_9$ from the timing counter 20. The address counter 71 counts each of the "0" outputs from the NAND circuit 79. When the resulting 4-bit code from the address counter 71 corresponds to the address or memory unit $51_1$ selected by the closing of switch $S_1$, the decoder 72 responds to such 4-bit code from address counter 71 to provide a "0" output on the corresponding output line $L_1$. In response to such "0" output on line $L_1$, transistor 77 is made non-conductive with the result that the output of the NAND circuit 79 remains at "1" and and the address counter 71 ceases counting. Accordingly, the 4-bit code corresponding to the switch $S_1$ is applied to the memory 50 for selecting or activating the address or memory unit $51_1$ corresponding to the switch $S_1$.

Since tuning information for channel "one" in the Tokyo area, which is a low vhf channel, is to be programmed in the memory unit $51_1$, the switch $S_L$ of the band indicating signal forming circuit 80 is closed to provide an output "1" from the respective inverter $82_L$. Since the mode changeover switch 61 is engaged with its fixed contact $a$, its output $P_A$ is "1" and, therefore, the output of the NAND circuit $83_L$ becomes "0". The band memory 84 responds to such "0" output from the NAND circuit $83_L$ to provide the band selecting pulse $P_L$ which, through the encoder 52 and the decoder 53 of the memory 50, provides the signal $V_L$ for selecting the low band or channel of the vhf tuning section in tuner 100.

Having selected the address or memory unit of the memory 50 at which a channel identifying code is to be programmed and the band or section of tuner 100 which is appropriate for the channel to be programmed at the selected address, the pulse generating circuit 30 is made operative, for example, by manually actuating the coarse up-tuning switch 31CU and holding the latter in its closed position. The closing of the switch 31CU causes the associated inverter $33_3$ to provide the output "1" to the NAND circuit $34_3$. Therefore, at each "0" state of the pulses $A_{14}$ from the timing counter 20, which pulses have a period of 4.096 m.sec., the NAND circuit $34_3$ provides an output "1". Since the fine up-tuning switch 31FU is open, the output of its associated inverter $33_1$ is "0" and the output of the respective NAND circuit $34_1$ is "1". Therefore, the output of the NAND circuit 36 becomes "0" at every "1" output from the NAND circuit $34_3$, that is, at every "0" state of the pulses $A_{14}$. Accordingly, an up-tuning pulse $P_U$ appears at the output of the inverter 37 at every "0" state of the pulses $A_{14}$ from the timing counter 20. Since such pulses $A_{14}$ have a relatively short period of 4.096 m.sec., the pulses $P_U$ appearing while the switch 31CU is held in its closed condition may be considered coarse up-tuning pulses which, when being counted by the counter 40, cause relatively rapid changes in the count of this counter. In other words, when counting the coarse up-tuning pules $P_U$ from the generating circuit 30, the count of the counter is changed, in sequence, in the upward direction to similarly change the resulting channel identification code $B_1$, $B_2$---$B_{14}$ obtained from the counter 40 at every circulating period of the circulating code $A_1$, $A_2$---$A_{14}$ from the timing counter 20, starting from the state (00000000000000), as shown in FIG. 4C. The changing channel identification code from the counter 40 and the circulating code from the timing counter 20 are applied to the pulse-width modulator 91 in the programming mode of operation. Since the circulating code $A_1$, $A_2$---$A_{14}$ changes at every time $\tau = 0.25$ $\mu$sec., which is the width of the pulses $A_1$, the width of the output pulse $P_W$ from the modulator 91 is increased by $\tau$ at every circulating period T of the circulating code starting from a pulse width of zero. Thus, so long as the switch 31CU of the pulse generating circuit 30 is held in its closed condition, the channel selecting, or control, voltage from the low pass filter 92 is increased progressively, for example, by about 2 m.V at every period T-4.096 m.sec. of the circulating code, the hence the receiving frequency establishing by tuner 100 increases progressively.

When a video picture being broadcast or transmitted by channel "one" appears on the screen of the television receiver, the coarse up-tuning switch 31CU is released by the operator so as to return to its normal open condition. Upon opening the switch 31CU, the supplying of the coarse up-tuning pulses $P_U$ to the counter 40 is terminated so that the counter 40 ceases its counting action and the channel identification code $B_1$, $B_2$---$B_{14}$ then obtained from the counter 40 determines the approximate value of the receiving frequency of the tuner 100 for the desired channel. Thereafter, the fine up-tuning switch 31FU may be manually actuated and held in its closed condition to provide fine up-tuning pulses $P_U$ from the inverter 37, which fine up-tuning pulses have a repetition rate 1/64 of the rate of the coarse up-turning pulses by reason of the divider 35. In counting the fine up-tuning pulses, the counter 40 sequentially changes the resulting channel identification code $B_1$, $B_2$---$B_{14}$ at every period 64T-262.144 m.sec. Thus, the width of the output pulses $P_W$ from pulse-width modulator 91 is increased by $\tau$ at every period 64T and, accordingly, the channel selecting or control voltage from low pass filter 92 is increased by about 2 mV at every period 64T for similarly changing the frequency to which the tuner 100 is turned. When the clarity of the picture on the screen of the television receiver indicates that fine tuning has been achieved in respect to the video signal broadcast by the desired channel, the switch 31FU is released to return to its open condition and thereby halt the supplying of the fine up-tuning pulses to the counter 40. Accordingly, the counter 40 stops counting with the resulting channel identification code $B_1$, $B_2$---$B_{14}$ corresponding to a value of the analog control voltage applied from the D/A converter 90 to the tuner 100 corresponding to a receiving frequency for the fine-tuned reception of channel "one". Of course, in the illustrated embodiment of the invention, after the switch 31CU or the switch 31FU has been selectively closed to bring the received frequency established by the code $B_1$, $B_2$---$B_{14}$ produced by the counter 40 to within the so-called pull-in range of the AFT circuit 120, the above described AFT operation may be relied upon to modify the code further to obtain the correctly tuned condition for the channel being programmed.

After the correctly tuned condition has been realized, either by selective actuation of the switches 31CU and 31FU, or by a combination of actuation of such switches and the AFT operation, the writing switch 62 is manually closed so that the associated inverter 64 provides the output "1". Since the mode change-over switch 61 remains engaged with its fixed contact $a$ to provide the output $P_A$ with the value "1", the NAND circuit 63 provides the output "0". As a result of such "0" output from the NAND circuit 63, the instruction signal forming circuit 65 first supplies an erasing pulse $P_E$ to the memory 50 to erase any contents previously stored in the memory unit $51_1$ selected by closing of switch $S_1$. Then, the circuit 65 applies a writing pulse $P_{WR}$ to the memory unit $51_1$ with the result that the channel identification code $B_1$, $B_2$---$B_{14}$ established by the counter 40 for fine-tuning of channel "one" and the band identifying signal $P_L$ from the band memory 84 are then written in the respective cells of the memory unit $51_1$.

Following the programming of the memory unit $51_1$ with a channel identification code and a band indicating code corresponding to channel "one", some or all of the other memory units $51_2$-$51_{16}$ of memory 50 may be similarly programmed with coded information corresponding to other vhf or uhf channels that are receivable in the region where the television receiver is located.

Although the programming of the channel selecting apparatus according to this invention has been described above as being effected by the sequential closing of the coarse up-tuning switch 31CU and the fine up-tuning switch 31FU, in which case, the coarse or fine up-tuning pulses $P_U$ are counted in the upward direction by the counter 40 for progressively increasing the frequency to which the tuner 100 is tuned. It will be apparent that the programming operations can be similarly effected by the successive closing of the coarse down-tuning switch 31DC and the fine down-tuning switch 31FD so that the counter 40 is made to count in the downward direction for progressively decreasing the frequency to which the tuner 100 is tuned. Whether the counter 40 is made to count in the upward direction or in the downward direction is merely dependent upon the relationship of the channel frequency which is to be programmed relative to the frequency of the channel which has been previously programmed and, in each case, the direction in which the counter 40 is made to count is selected so as to minimize the time required for the programming operation.

CHANNEL SELECTING MODE OF OPERATION

After the programming of the memory 50 has been completed, as described above, the mode change-over switch 61 is manually actuated to engage its fixed contact $b$ and thereby to provide the output $P_A$ with the value "0" for establishing the channel selecting mode of operation for the apparatus. Since the writing switch 62 remains in its open position, the output of the associated inverter 64 is "0" and, accordingly, the NAND circuit 63 provides the output "1" to the instruction signal forming circuit 65 so that the latter supplies the reading pulse $P_R$ to the memory 50.

Preferably, when the power source for the channel selecting apparatus is initially turned on, the address counter 71 of address selecting circuit 70 is reset thereby so that the 4-bit code issuing from counter 71 will activate or address the memory unit $51_1$ in the memory 50.

When the power source for the channel selecting apparatus is initially turned on, the transistor 46 in the time constant circuit 47 is made conductive so that its collector output is "0" for a predetermined period of, for example, 50 m.sec., whereupon the transistor 46 is made non-conductive and its collector output rises to the value "1". Such rise in the collector output of the transistor 46 triggers the monostable multivibrator 45 to provide an output pulse from the latter at the level "1" for the predetermined time of 50 m. sec. Since the output $P_A$ from the mode change-over switch 61 is "0" for the channel selecting mode of operation, the output from inverter 43 is "1" and, therefore, the output from the NAND circuit 44 is "0" for the predetermined time or period of the output pulse from the monostable multivibrator 45. Such "0" output from the NAND circuit 44 causes the inverter 48 to produce the output "1", that is, the load pulse $P_B$ for the period of the output pulse from the monostable multivibrator 45. The load pulse $P_B$, when applied to AND circuits $42_1$-$42_{14}$ in the counter 40, allows the readout to the counter 40 from the memory unit $51_1$ of the channel identification code $C_1$, $C_2$---$C_{24}$ previously stored therein and which, in the example described above, represents channel "one" in the Tokyo area. At the same time, the band indicating code stored in the respective cells of the memory unit $51_1$ is read out from the latter to the decoder 53 so that, in the described example, the signal $V_L$ is applied to the tuner 100 for selecting the low band of the vhf tuning section. During the existence of the load pulse $P_B$, the bits $C_1$-$C_{14}$ of the readout channel identification code are applied to the respective flip-flops $41_1$-$41_{14}$ of the counter 40 with the result that these flip-flops assume the states for providing the channel identification code $B_1$-$B_{14}$ from the counter 40 to the pulse-width modulator 91 which, during programming, was determined to correspond to a control voltage for the tuner 100 suitable for fine tuning of the receiving frequency to that of channel "one". Therefore, upon the initial supplying of power to the channel selecting apparatus, the latter tunes the television receiver for the reception of the channel which has been programmed into the first address or memory unit $51_1$ of memory 50.

Thereafter, if it is desired to receive a channel programmed in a memory unit of the memory 50 other than the first address or memory unit $51_1$, for example, if it is desired to receive channel "three" which has been programmed in the second memory unit $51_2$, the switch $S_2$ of the address selecting circuit 70 is manually closed and, as previously described in connection with the programming mode of operation, the address counter 71 counts the pulses $A_9$ until the 4-bit code from the address counter 71 addresses the second memory unit $51_2$ for causing readout of the channel identification code and band indicating code stored in that memory unit during the programming of channel "three" in the memory unit $51_2$. When the code from the address counter 71 addresses the memory unit corresponding to the closed switch $S_2$, the decoder 72 provides the signal "0" on the respective output line $L_2$ so that the transistor 77 is made non-conductive and its collector output rises from "0" to "1". Such rise in the collector output of the transistor 77 triggers the monostable multivibrator 45 and, as previously described, the output from the monostable multivibrator 45 results in the production of a load pulse $P_B$ from the inverter 48. In response to the load pulse $P_B$, the channel identification code being read out of memory unit $51_2$ correspondingly changes the states of the flip-flops of the counter 40 so that the latter provides the corresponding channel identification code $B_1$, $B_2$---$B_{14}$ to the pulse width modulator 91. Therefore, the output pulse $P_W$ obtained from the modulator 91 during each circulating period of the circulating code $A_1$, $A_2$—$A_{14}$ has its width determined by the channel identification code so as to result in an analog control voltage from the low pass filter 92 to the tuner 100 sufficient to tune the latter to channel "three".

It will be apparent that the channels programmed in the other memory units $51_3$-$51_6$ may be similarly selectively received merely by manual closing of the corresponding address selecting switch $S_1$–$S_{16}$.

Although the memory 50 is initially programmed with correct channel identification codes $B_1$, $B_2$---$B_{14}$ to set the varactor of the tuner 100 to the necessary values to tune to the respective channels, a shift from such correctly tuned condition may occur over a period of time due to a temperature drift, annual variation, or the like in the electronic tuning tuner 100. In other words, at some time after the programming of a memory unit in the memory 50 with a channel identification code, the tuner control voltage that results from the application of the programmed code to D/A converter 90 in the channel selecting mode of the apparatus may no longer set the tuner to receive the proper frequency of the respective channel. In that event, the AFT circuit 120 provides an output, $E_U$ or $E_D$, according to the drift, to cause the circuit 30 to apply either upward or downward correcting pulses to the counter 40 to modify the channel identification code $B_1$, $B_2$---$B_{14}$ applied from the counter 40 to the converter 90 increment by increment until the correctly tuned condition is restored.

It should be noted that the foregoing AFT operation in the channel selecting mode of the apparatus id delayed to commence a predetermined time after power is first applied to the apparatus, or after a selected one of the switches $S_1$, $S_2$---$S_{16}$ is closed for selecting a respective one of the memory units in the memory 50 for readout of the channel identification code stored therein. More particularly, when the power source for the apparatus is initially turned on, or when one of the switches $S_1$–$S_{16}$ is closed, the resulting collector output of transistor 46 or transistor 77, respectively triggers the inhibit monostable multivibrator 142 to provide the inhibit pulse $P_G$ for 10 m.sec. During that period of time, the inhibit pulse $P_G$ prevents upward or downward correction pulses from reaching the counter 40 even though the AFT circuit may then be providing the output $E_U$ or $E_D$. Thus, the onset of the AFT operation is delayed until the address selecting circuit 70 has completed the previously described operations of selecting a memory unit 51, in the memory 50 in response to the initial connection of the apparatus to its power source or in response to the closing of one of switches $S_1$–$S_{16}$, and until the control voltage applied to the tuner 100 has attained a level corresponding to the channel identification code being read out of the selected memory unit. The foregoing delay in the onset of the AFT operation avoids the possibility that the AFT operation will seek to pull-in the local oscillation frequency at some region other than the desired normal tuned condition if the AFT operation is permitted when power is first applied to the apparatus or when the circuit 70 is changing over from the selection of one to another of the addresses in the memory 50.

When the AFT operation does occur with the apparatus in its channel selecting mode, the upward or downward correction pulses $P_{UD}$ applied to the counter 40 for modifying the code $B_1$, $B_2$---$B_{14}$ applied from the latter to the D/A converter 90 to obtain the correctly tuned condition, are also counted by the counter 133. When the number of such upward or downward correction pulses reaches $n$, that is, when the frequency resulting from the channel identification code stored in the selected memory unit of the memory 50 is at least 50 kHz greater than or less than the local oscillation frequency for the normal or correct tuned condition, but still within the pull-in range of the AFT circuit, the memory rewriting circuit 130 provides the rewriting instruction $P_M$. As previously described, such rewriting instruction causes the modified channel identification code $B_1$, $B_2$---$B_{14}$ then produced by the counter 40 to be written in the selected memroy unit in place of the channel identification code previously written therein.

By reason of the above described rewriting operation, if the tuner 100 undergoes a progressive change in the relationship between its control varactor voltage and the frequency to which the tuner 100 is set, due to temperature drift, annual variation or the like, each periodic selection of each memory unit for selection of the respective channel causes the AFT operation to provide the correctly tuned condition and, if at any time, such AFT operation approaches the limits of its pull-in range, the code stored in the memory unit is replaced by a new code corresponding to the changed relationship between the control voltage and the actual frequency to which the tuner is tuned. This ensures that the pull-in range of the AFT circuit will not be exceeded.

Although the rewriting operation could be effected each time the channel identification code being read out of a memory unit is modified by the AFT operation, it is preferred that the rewriting operation occur only when the AFT correction exceeds a predetermined amount, as described above, particularly when the memory is composed of non-volatile memory cells, as such cells are, in general, limited as to number of times information can be rewritten therein.

In the illustrated embodiment of the invention, the control of the rewriting or memory refreshing operation is effected by directly counting the correction pulses $P_D$ resulting from the AFT operation, and performing the rewriting operation when the number of correction pulses exceeds a predetermined value. However, other means may be employed for controlling the rewriting or memory refreshing operation. For example, a buffer (not shown) may be provided separate from the counter 40 to store the channel identification code being read out of a selected memory unit, whereupon the contents of the counter 40, after the same are modified by an AFT operation, are compared with the contents stored in the buffer to cause the rewriting operation to occur when the compared contents differ from each other by at least a predetermined amount.

Further, the pulse width modulator 91 and the low-pass filter 92 provided in the illustrated embodiment for converting the digital channel identification codes into respective control voltages for the tuner 100 can be replaced by any other D/A converter, for example, consisting of switching elements and weighted resistors for achieving the same result.

It is further to be noted that the present invention avoids a serious problem encountered in effecting AFT operation in connection with an electronically tuned tuner employing a varactor as its tuning element. Such varactors or variable capacitance diodes have non-linear voltage-capacitance characteristics. In other words, as the receiving frequency is increased, progressively increasing changes in the control voltage are required to effect unit or incremental changes in the receiving frequency. Therefore, the change in the control voltage required to effect a predetermined change in the receiving frequency is different for each of the channels. Therefore, in the existing AFT circuits associated with the electronic tuning tuners, the correction or AFT sensitivity has had to be different or changed-over for each of the channels so that the construction of the AFT circuit becomes undesirably complex.

As distinguished form the foregoing in the channel selecting apparatus according to this invention, the AFT circuit 120 merely indicates by its discriminated outputs $E_U$ and $E_D$ the direction of the necessary change in the control voltage for achieving the correctly tuned condition. Therefore, the AFT operation can be simply and accurately performed in a wholly automatic fashion.

Figure 8:
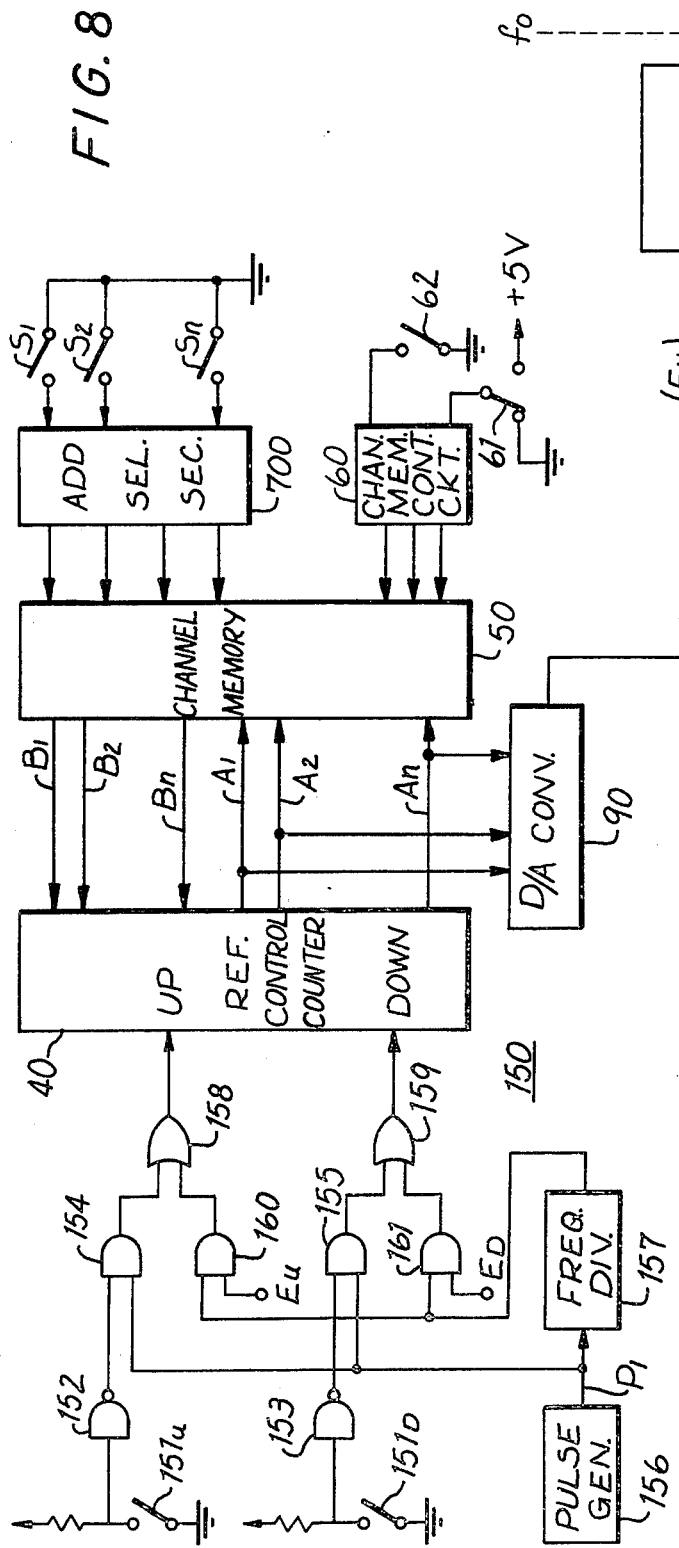
FIG. 8 is a block diagram illustrating channel selecting apparatus according to this invention to overcome the effect of AFT when deliberately tuning from one channel to another.

FIG. 8 is a circuit diagram of an electronic tuning system with a digital control circuit for an electronic tuner with AFT to maintain the frequency to which the tuner is tuned at the proper value for the desired channel. Means are provided in FIG. 8 to overcome the effect of the AFT circuit but without disabling or disconnecting that circuit.

Figure 9:
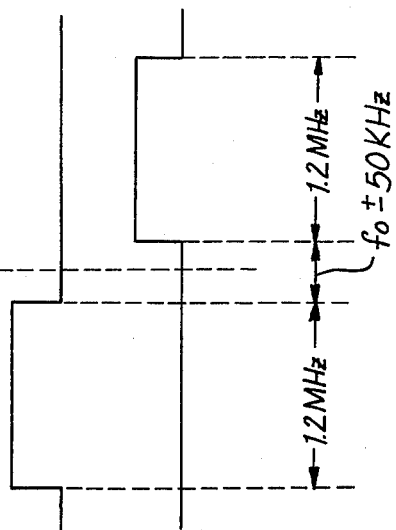
FIGS. 9A and 9B are waveform diagrams illustrating AFT logic signals for effecting up-tuning and down-tuning, respectively.

In FIG. 1 the electronically tuned tuner 100 is controlled by a tuning voltage developed by the D/A circuit 90. This voltage is indicated in FIG. 8 as $V_c$ and is applied as a reverse bias voltage to the one or more variable capacitance diodes, or varactors, that determine the frequency to which the tuner 100 is tuned. The tuner may also be supplied with a band change-over signal in the same manner as the tuner 100 in FIG. 1 so that it can be switched to receive both the high and low channels of the vhf band and the channels in the uhf band. The tuner 100 in FIG. 8 is shown as part of a television receiver that includes the video IF amplifier 110 and a video detector 111, a video amplifier 112 and a cathode ray picture tube 113. The AFT circuit 120 is connected to the output of the IF amplifier 110 in the same manner as in FIG. 1, and the AFT circuit in FIG. 8 may be identical with the AFT circuit described in connection with FIGS. 5 and 6A-6C. A frequency discriminator 121 (FIG. 5) having an input versus output characteristic in the form of an S-shaped curve shown in FIG. 6A, produces an instruction signal $E_U$ when the output voltage of the discriminator circuit 121 is above the level $V_1$. The AFT circuit also produces an instruction signal $E_D$ when the output voltage of the discriminator 121 is below the voltage $V_2$. It has been explained originally in connection with FIG. 5 that the effective voltages $E_U$ and $E_D$ begin when there is a frequency difference $\Delta f$ of ±50 kHz between the desired center frequency $f_o$ and the carrier of the received signal. Since the S-shaped response characteristic drops off after reaching its peak point, either the positive peak or the negative peak, at frequencies sufficiently distant from the frequency $f_o$ the output voltage of the discriminator 121 will be less than the voltage $V_1$ or greater than the voltage $V_2$. The characteristic curve of the circuit is arranged so that the outer frequencies at which the AFT voltages are available are approximately ±1.2 mHz. Thus, as shown in FIG. 9, the signal $E_U$ has the value "0" below a frequency equal to $f_o - 1.2$ mHz and a value "0" above a frequency $f_o - 50$ kHz. Between the frequencies $f_o - 1.2$ mHz and $f_o - 50$ kHz, the value of the signal $E_U$ is "1".

Conversely, the output voltage of the frequency discriminator 121 in FIG. 5 is lower than the voltage $V_2$ only in the frequency sub-range between approximately $f_o + 50$ kHz and $f_o + 1.2$ mHz. At other points outside that sub-range the frequency signal $E_D$ has the value "0". These logic signals are illustrated in FIG. 9. It is appropriate to think of the entire AFT band between $f_o - 1.2$ mHz and $f_o + 1.2$ mHz as being the AFT range within which the AFT circuit 120 operates. This range is divided into one sub-range for the signal $E_U$ and another sub-range for the signal $E_D$.

As in FIG. 1, the circuit in FIG. 8 includes a counter 40 for generating channel identification codes and a channel identification code memory 50. The relationship between the counter 40 and the memory 50 is described in detail in connection with FIG. 1.

The circuit also includes an address selecting section 700 that includes the address counter 71 and a decoder 72 in FIG. 1. The circuit 700 is controlled by address section switches $S_1-S_N$ in a manner such as is shown in FIG. 1. In FIG. 1, the number $n$ for the highest numbered switch is 16. The manner in which the switches $S_1-S_N$ and the address selecting section 700 control the channel memory 50 corresponds to the manner in which the code memory 50 in FIG. 1 is controlled by the address counter 71 and the switches $S_1-S_{16}$ and need not be described again in detail.

Briefly, when the receiver is put into use in a given region, certain of the switches $S_1-S_N$ are closed, in turn, and the count is recorded in corresponding sections of the memory 50. According to each of the switches in each memory section the count, when converted into an analog signal by the D/A converter 90 becomes the analog voltage $V_c$ to control the tuner 100. Thereafter, each time one of the switches is closed, its particular memory section in the memory 50 is actuated and a count corresponding to the count stored in that memory section is applied to the D/A converter 90 to return the tuner to the desired channel.

The circuit in FIG. 8 further includes a channel memory counter circuit 60 which may be similar to the circuit 60 in FIG. 1 and which is controlled by a mode switch 61 and a writing or programming switch 62 that operates in the same manner as the switches 61 and 62 in FIG. 1. The channel memory counter circuit 60 controls the erasing, writing and reading signals to be applied to the memory 50 in accordance with whether the memory is being programmed (which requires erasure of any previous program at that memory section) or is being readout in the normal operation of the receiver after it has been programmed.

The section of the circuit in FIG. 8 that is different from the corresponding section of the circuit in FIG. 1 is the tuning pulse section 150. This section includes an uptuning switch 151U and a downtuning switch 151D, each of which is connected in series with its respective resistor between the positive power supply voltage +5V and ground. The common circuit point between the respective switches 151U and 151D and their series-connected resistors comprise input terminals to a pair of inverters 152 and 153, respectively. When the switches 151U and 151D are open, a "1" signal is applied to the corresponding inverter and when the switches are closed the "0" signal is applied. The output terminals of the inverters 152 and 153 are each connected to one input terminal of a corresponding AND circuit 154 and 155. The other input terminal of each of these AND circuits is connected to the output terminal of a pulse generator 156 that generates a pulse signal $P_1$ of a predetermined frequency F. The output of the pulse generator 156 is also connected to the input of a frequency divider 157, which in this case divides the frequency of the pulse $P_1$ by 2. The output terminals of the AND circuit 154 and 155 are connected, respectively, to one of the input terminals of a pair of OR circuits 158 and 159. The output terminal of the frequency divider 157 is connected to one input terminal of each AND circuits 160 and 161. The up-tuning signal $E_U$ from the AFT circuit 120 is connected to another input terminal of the AND circuit 160 and the output of this AND circuit is connected to another input terminal of the OR circuit 158, the output terminal of which is connected to the UP input circuit of the counter 40. A second input terminal of the AND circuit 161 is connected to the down-tuning output terminal to receive the down-tuning signal $E_D$ of the AFT circuit 120. The output terminal of the AND circuit 161 is connected to an input terminal of the OR circuit 159 and the output terminal of this OR circuit is connected to the DOWN terminal of the counter 40.

Pulse signals that reach the UP terminal of the counter 40 by way of the OR circuit 158 cause the counter to count UP. On the other hand, signals that reach the DOWN terminal of the counter 40 by way of the OR circuit 159 cause the counter to count DOWN. The pulse signals to be counted, in either case, are obtained from the pulse generator 156. These pulses are able to reach the OR circuit 158 if the AND circuit 154 has been enabled by a "1" at the output of the inverter 152 corresponding to closure of the switch 151U to produce a "0" at the input of that inverter. Similarly, pulse signals $P_1$ from the pulse generator 156 can reach the OR circuit 159 if the AND circuit 155 has been enabled by a "1" at the output of the inverter 153 due to a "0" at the input of that inverter. A "0" at the input of the inverter 153 is obtained by closure of the switch 151D.

When the memory 50 in FIG. 8 is to be programmed initially, the arm of the mode switch 61 is switched to the terminal connected to the +5V power supply voltage. This places the circuit 60 in position to write in a channel code in the memory 50. The address at which the code is to be written in is determined by closing one of the switches $S_1$–$S_N$. Then the code itself is generated by closing one or the other of the switches 151U or 151D. If it is assumed that the initial programming starts with the tuner 100 at its lowest frequency, the up-tuning switch 151U should be closed, thereby placing the AND circuit 154 in condition to allow the pulses $P_1$ to pass through this AND circuit and the OR circuit 158 to the UP input terminal of the counter 40. As the pulses cause the count in the counter 40 to increase, the output analog voltage of the D/A converter 90 changes to raise the frequency to which the tuner 100 is tuned. When the desired frequency is reached, the up-tuning switch 151U may be open, or in fact, when the tuning is below the desired frequency $f_o$ by about 1.2 mHz the up-tuning switch 151 can be open, the AFT circuit 120 can be allowed to tune the tuner 100 into the desired frequency $f_o$.

The AFT circuit 120 generates the up-tuning signal $E_U$ that has a value starting at the edge of the subrange 1.2 mHz below $f_o$. This signal having a value of "1" places the AND circuit 160 in condition to allow output pulses from the frequency divider 157 to pass through the AND circuit and the OR circuit 158 to the UP terminal of the counter 40. However, the frequency of the pulses that pass through the AND circuit 160 are lower than the frequency of the pulses $P_1$ by the frequency division ratio of the frequency divider 157. In the illustrated example, the pulses that pass through the AND circuit 160 have a frequency one-half that of the pulses that pass through the AND circuit 154. Thus the automatic fine tuning takes place somewhat more slowly than if the switch 151U were held closed until the exact frequency $f_o$ had been reached by the tuner 100, but the fine tuning is not so slow as to be objectionable.

Once the counter 40 reaches the count that causes the tuner 100 to be at the desired frequency, the writing switch 62 can be closed to record the proper count at the selected address determined by the particular switch $S_1$–$S_N$ that has been closed. The process can then be repeated to tune in and record the count code of another channel at another address.

If it is assumed that the second channel code to be recorded corresponds to a channel at a higher frequency $f_o$ than the initially recorded code, the up-tuning switch 151U will again have to be closed to increase the count in the counter 40. However, the AFT circuit 120 is always in operation and as the counter 40 starts to count UP, the down-counting signal $E_D$ will become a "1" in the sub-range $f_o+50$ kHz to $f_o+1.2$ mHz. It is in order to allow the count in the counter 40 to progress upwardly and not be held back by the AFT signal $E_D$ (or downwardly and not be held back by the up-tuning signal $E_U$) that the pulses $P_1$ are frequency divided in the circuit 157. When the AFT 120 produces a "1" signal $E_D$ applied to the AND circuit 161 while the switch 151U is closed to allow pulses $P_1$ to reach the UP input terminal of the counter 40, the pulses that pass through the AND circuit 161 and the OR circuit 159 to the DOWN terminal of the counter will have a lower frequency than the up-counting pulses. Thus the pulses controlled by the AFT circuit 120 will not entirely be able to prevent the counter 40 from being shifted to a higher count (or, to a lower count if it is the switch 151D that is closed). Once the count in the counter 40 passes beyond the upper limit $f_o+1.2$ mHz of the lower frequency channel, the count increases in speed corresponding to the frequency of the pulse signal $P_1$ until the next channel comes within the AFT range that extends from 1.2 mHz below the frequency $f_o$ of the next channel to 1.2 mHz above the frequency $f_o$ of that channel.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A channel selecting apparatus comprising an electronically tuned tuner, a reversible counter having an UP input terminal and a DOWN input terminal to receive pulses to cause said counter to count UP and DOWN, respectively, digital-to-analog converter means connected to said counter to receive digital count from the latter and to convert the same to an analog signal to control the tuning of said tuner, an automatic fine tuning circuit comprising means to generate automatic fine tuning control signals when said tuner is tuned within an automatic fine tuning range centered about a channel frequency, said signals including an up-tuning control signal when said tuner is tuned within said range but below the channel frequency in that range and a down-tuning control signal when said tuner is tuned within said range between the channel frequency in that range and an upper frequency of that range, a source of first pulses having a predetermined frequency, first connection means for selectively channeling said first pulses to said UP and DOWN input terminals of said counter for bringing said tuner from one channel to another, a source of second pulses having a frequency lower than that of said first pulses, and second connection means for selectively channeling said second pulses to said UP and DOWN input terminals, said automatic fine tuning circuit being connected to said second connection means to cause said second connection means to transmit said second pulses to said UP input terminal in response to said up-tuning control signal and to transmit said second pulses to said DOWN input terminal in response to said down-tuning control signal.

2. The channel selecting apparatus of claim 1 in which said first connection means comprises:

first and second AND circuits both connected to receive said first pulses from said source thereof, said first AND circuit being connected to said UP input terminal and said second AND circuit being connected to said DOWN input terminal; and selective means to enable either of said AND circuits to allow the passage therethrough of said first pulses to the respective UP or DOWN input terminal.

3. The channel selecting apparatus of claim 2 in which said selective means comprises switch means to apply, selectively, a "1" signal to said first or said second AND circuit to enable that selected AND circuit to pass said first pulses to the respective UP or DOWN input terminal.

4. The channel selecting apparatus of claim 1 in which said means to produce said second pulses comprises a frequency divider connected to said source of said first pulses to divide the frequency of said first pulses to that of said second pulses.

5. The channel selecting apparatus of claim 4 in which said frequency divider is a divide-by-two frequency divider.

6. The channel selecting apparatus of claim 1 comprising first and second AND circuits both connected to said means to produce second pulses, said first AND circuit being connected to a terminal of said fine tuning circuit to receive said up-tuning control signal therefrom and said second AND circuit being connected to a second output terminal of said fine tuning circuit to receive said down-tuning control signal therefrom, said first AND circuit being connected to said UP input terminal to supply said second pulses thereto when said up-tuning control signal has a logic value of "1", and said second AND circuit being connected to said DOWN input terminal to supply said second pulses thereto when said down-tuning control signal has a logic value of "1".

7. The channel selecting apparatus of claim 6 comprising third and fourth AND circuits both connected to said source of first pulses;

first actuation means connected to said third AND circuit to apply a signal having a logic value of "1" to said third AND circuit, selectively, to allow said third AND circuit to conduct said first pulses therethrough;

second actuation means connected to said fourth AND circuit to supply selectively a signal having a logic value of "1" to make said fourth AND circuit conductive to said first pulses;

a first OR circuit having an output terminal connected to said UP input terminal of said counter and having input terminals connected to output terminals of said first and third AND circuits to transmit to said UP input terminal either said first pulses or said second pulses;

a second OR circuit having an output terminal connected to said DOWN input terminal of said counter and having input terminals connected to output terminals of said second and fourth AND circuits to supply to said DOWN input terminal said first or second pulses, the transmission of said first pulses through said third and fourth AND circuits being determined by said first and second actuation means, respectively and alternately, and the transmission of said second pulses through said first and second AND circuits being controlled by said up-tuning and down-tuning control signals, respectively, of said automatic fine tuning circuit independently of said actuation means.

* * * * *